Figure 1:
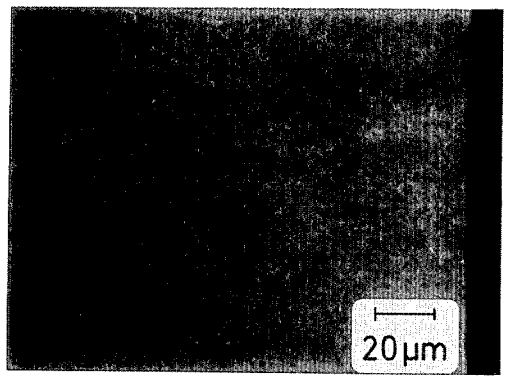

United States Patent [19]

Fronius et al.

[11] Patent Number: 4,732,648
[45] Date of Patent: Mar. 22, 1988

[54] METHOD OF PREPARING SEMICONDUCTOR SUBSTRATES

[75] Inventors: Hans Fronius, Stuttgart; Albrecht Fischer, Lochgau; Klaus Ploog, Stuttgart, all of Fed. Rep. of Germany

[73] Assignee: Max Planck Gesellschaft zur Foerderung der Wissenschaften e.V., Goettingen, Fed. Rep. of Germany

[21] Appl. No.: 942,473

[22] Filed: Dec. 16, 1986

[30] Foreign Application Priority Data

Dec. 17, 1985 [EP] European Pat. Off. ........ 85116120.8
Apr. 11, 1986 [EP] European Pat. Off. ........ 86105025.0

[51] Int. Cl.$^4$ .................. H01L 21/306; B44C 1/22; C03C 15/00; C03C 25/06
[52] U.S. Cl. .................................. 156/636; 156/637; 156/645; 156/651; 156/662; 156/903; 252/79.1; 252/79.2; 252/79.5
[58] Field of Search ............... 156/636, 637, 645, 662, 156/903, 651; 252/79.1, 79.5, 79.2; 437/126, 228, 234

[56] References Cited

U.S. PATENT DOCUMENTS 3,342,652  9/1967  Reisman et al. ................ 156/903 X
3,348,987 10/1967  Stark et al. ..................... 156/645
3,738,882  6/1973  Basi .............................. 156/903 X

*Primary Examiner*—William A. Powell
*Attorney, Agent, or Firm*—Townsend & Townsend

[57] ABSTRACT

A new method for GaAs substrate preparation which significantly reduces the formation of oval defects during MBE growth of selectively doped n-$Al_xGa_{1-x}As$/-GaAs heterostructures. The method simply requires treatment in $H_2SO_4$ after mechano-chemical polishing in NaOCl solution and generation of a protective surface oxide during in soldering. Routinely a density of oval defects of less than 200 cm$^{-2}$ is achieved for 2-$\mu$m thick heterostructures. The efficiency of the new preparation procedure is demonstrated by 2DEG mobilities in excess of $10^6$ cm$^2$/Vs at 6K obtained with a spacer width as narrow as 18 nm.

11 Claims, 2 Drawing Figures

METHOD OF PREPARING SEMICONDUCTOR SUBSTRATES

The present invention relates to a method of preparing semiconductor substrates to reduce the formation of defects, in particular of oval defects during subsequent growth of semiconductor structures thereon, in particular growth of heterostructures by molecular beam epitaxy, wherein the substrates are chemically cleaned and are provided with a thin oxide layer as protection against contamination during handling prior to growth of a said semiconductor structure thereon.

A method of the above kind is described in U.S. Pat. No. 3,969,164 and also in the paper by Dr. K. Ploog in "Crystals: Growth, Properties and Applications" edited by H. C. Freyhardt, Springer Press, Berlin, Heidelberg 1980, vol. 3, page 73 and in a paper by A. Y. Cho entitled Growth of III-V Semiconductors by Molecular Beam Epitaxy and their Properties published in 1983 in "Thin Solid Films", vol. 100, page 291.

A method of this kind is of particular interest in connection with the growth by molecular beam epitaxy of selectively doped n-$Al_xGa_{1-x}As$/GaAs heterostructures, the method is however not restricted to these structures and preliminary investigations indicate that it can also be used with other semiconductor substrates.

A contamination-free GaAs surface is crucial for the quality of the GaAs and $Al_xGa_{1-x}As$ layers subsequently grown by molecular beam epitaxy (MBE). The substrate wafers are normally cleaned with various chemical solutions, and then a thin oxide layer is produced to protect the GaAs surface from contamination during further handling. The most commonly used method to prepare GaAs substrates is chemical etching based on a $H_2SO_4/H_2O_2/H_2O$ mixture, which was assumed to produce a passivating thin surface-oxide layer. This oxide layer, which is removable by heating prior to MBE growth, preserves the etched surface from carbon contamination during substrate handling after the etching process. Recently, however, it has been shown that the procedure of $H_2SO_4/H_2O_2/H_2O$ etching and rinsing in water does in fact not produce any passivating oxide film on the (100) GaAs surface. Instead, the surface oxide is produced only by the sample handling in air after etching, in particular during heating for indium soldering on the molybdenum sample holder.

More specifically the prior art method involves multiple degreasing by successively rinsing the substrate in trichloroethylene, acetone and then water. Thereafter the substrate is boiled in hydrochloric acid and free-etched in a stagnant solution of (3:1:1) $H_2SO_4/H_2O_2/H_2O$ at 48° C. for one minute. (The aforementioned concentration, temperature and time statements are typical values which may be varied in practice). To stop the etchant the substrate in wafer form is then flooded in water and blown-dry with filtered $N_2$ gas.

It will be apparent from the foregoing that the known method involves a large number of separate steps and is particularly complicated by the need to use the boiling hydrochloric acid and an etching solution at an elevated temperature. The plurality of steps involved also means that substrate treatment takes a relatively long period of time.

The object underlying the present invention is thus to provide a method of preparing semiconductor substrates of the initially named kind which is simple and can be carried out relatively rapidly and which reliably and drastically reduces the formation of oval defects during subsequent growth of semiconductor structures on the substrate. It is a further object of the present invention to provide a method of preparing semiconductor substrates which allows them to be stored in air for a considerable period of time, of at least two to three weeks, prior to the growth of semiconductor structures thereon, without loosing their defect inhibiting properties.

In order to satisfy these objects there is provided, in accordance with the present invention, a method of the initially named kind, which is characterised in that the substrate is first subjected to mechano-chemical etch polishing using a fabric or paper polishing lap soaked with an oxidising-etching solution, and is then treated by placing it in a concentrated acid, in particular $H_2SO_4$ subjected to agitation.

The oxidising etching solution is preferably NaOCl, preferably with a concentration in the range 0.5 to 6.5 % active chlorine, and in particular with a concentration of 2.0 %.

Most particularly the substrate is preferably GaAs and the concentrated acid is $H_2SO_4$ (preferably with a concentration of 98 %).

With this method both the mechano-chemical etch polishing and the treatment in concentrated acid are carried out at room temperature. Accordingly no complicated and potentially dangerous thermal treatments are required. The treatment step in concentrated acid is preferably carried out by sequentially placing the substrate in two separate baths of the concentrated acid while the baths are subjected to ultrasonic agitation.

It will be seen from the foregoing that the total number of steps involved are fewer than with the known method and that all treatment is carried out at room temperature and indeed using relatively simple chemicals and apparatus, all of which combine to yield a substantial time saving. Moreover, the efficiency of the new substrate preparation procedure is demonstrated by the excellent quality of selectively doped n-$Al_xGa_{1-x}As$/GaAs heterostructures which have been produced and which exhibit a high mobility two-dimensional electron gas (2DEG). More specifically mobilities in access of $10^6 cm^2/Vs$ have been obtained under illumination using a 18 nm undoped $Al_xGa_{1-x}As$/GaAs spacer. These values are among the highest reported for this narrow spacer. Even more important is the fact that the density of overall defects is drastically reduced to routinely below 200 $cm^{-2}$ by this substrate preparation method.

In accordance with the invention the mechano-chemical polishing step is conveniently carried out using a polishing lap comprising lens paper of the type sold by the company Polytex under the trade designation Supreme 1241142.

With a sawn substrate, the sawn surface is first polished with diamond paste to remove saw-cut damage prior to mechano-chemical etch polishing.

As mentioned above the method proposed herein is particularly suitable for use with gallium arsenide substrates. It is however not restricted to such substrates and may for example also be used with indium phosphide substrates.

Figure 2:
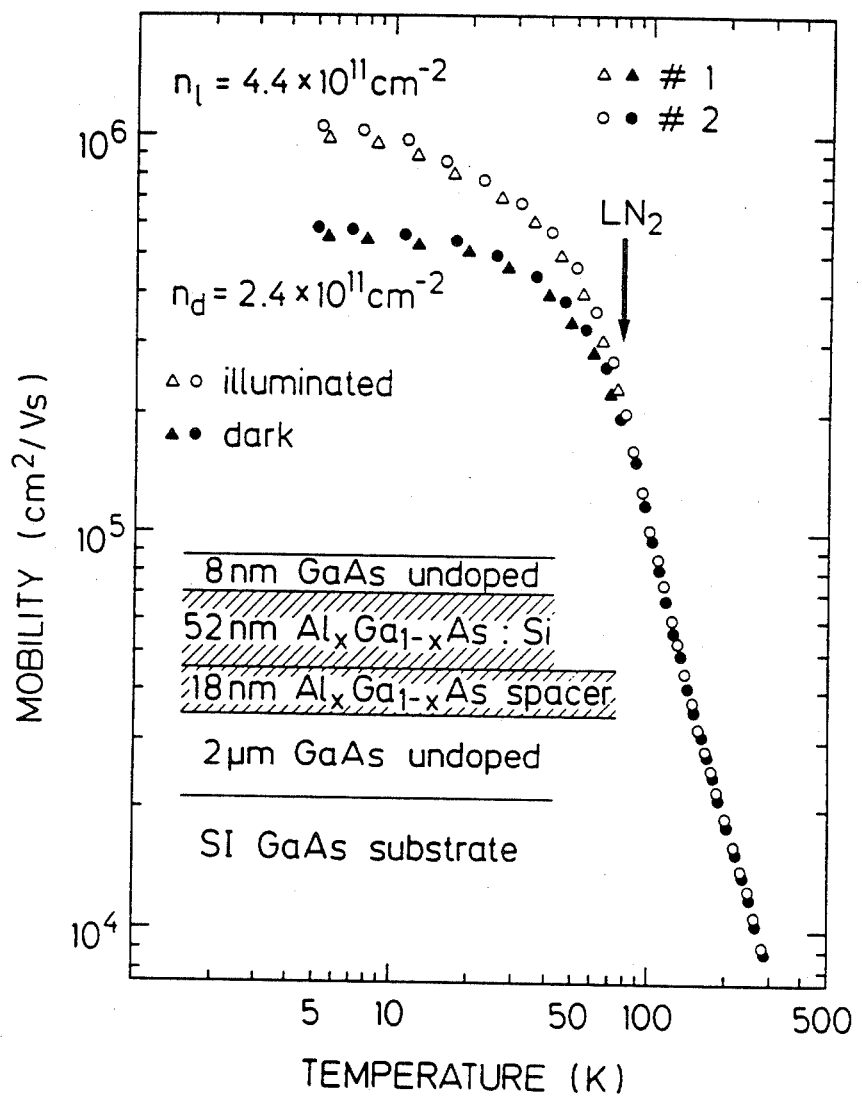

Although NaOCl is the preferred oxidising etching solution for GaAs substrates, it is also possible to use other oxidising etching solutions such as bromium methanol The invention will now be more fully described with reference to a specific example and with reference to the drawings in which:

FIG. 1 shows a micrograph of the semiconductor substrate surface after treatment in $H_2SO_4$, and FIG. 2 shows the Hall mobility as a function of temperature obtained from two heterostructures one deposited on a substrate prepared in accordance with the prior art method (sample 1) and the other deposited on a substrate prepared in accordance with the present invention (sample 2).

In the example given below a gallium arsenide substrate is prepared for the subsequent growth of Si-doped n-$Al_xGa_{1-x}As$/GaAs heterostructures.

The selectively Si-doped n-$Al_xGa_{1-x}As$ heterostructures were grown in an MBE system of the quasi-horizontal evaporation type which comprises a continuously rotating substrate holder and a liquid nitrogen ($LN_2$) cryoshroud encircling the entire growth region. The heterostructures were deposited on (100) oriented undoped semi-insulating GaAs substrate (etch-pitch density ca. $5 \times 10^4 cm^{-2}$) using a GaAs growth rate of 1 $\mu$m/hr and a growth temperature as low as 600° C. Two substrate slices cleaved from the same 2-inch diameter liquid encapsulation Czochralsky (LEC) grown GaAs wafer were soldered after treatment as described below to the Mo sample holder for simultaneous deposition.

The uncleaved wafer was first polished with diamond paste to remove saw-cut damage followed by etch-polishing (lapping) on an abrasive-free lens paper soaked with NaOCl solution leaving a mirror-like finish.

Half of the wafer was then etched in the following conventional manner. The slice was first rinsed successively in trichloroethylene, acetone and water for a final degrease. After boiling in hydrochloric acid, the substrate was free-etched in a stagnant solution of (3:1:1) $H_2SO_4$/$H_2O_2$/ $H_2O$ at 48° C. for one minute. To stop the etchant the wafer was flooded in water and blown-dry with filtered $N_2$ gas.

The second half of the GaAs wafer was simply placed twice in concentrated $H_2SO_4$ kept at 300K and stirred ultrasonically. The slice was then carefully rinsed in water and blown-dry with $N_2$. Both parts of the original wafer were then soldered with liquid indium to the preheated (250° C.) molybdenum sample holder under dust-free conditions, on a clean bench in a clean room, and immediately transferred to the sample load-lock system. For sample 2 the substrate is first heated to 250° to 300° C. for three minutes under dust-free conditions prior to soldering. This preheating is an important step of the invention. The duration of the two treatments in $H_2SO_4$ is uncritical and normally amounts to 5 to 10 minutes (per treatment). A substantially longer treatment time is not disadvantageous provided precautions are taken to ensure that the temperature of the sulphuric acid bath remains at room temperature. An increase in temperature is to be feared because the bath is ultrasonically stirred. The treatment in two subsequent acid baths is preferred so that contamination remains in the first bath.

Massies and Contour have shown that during this soldering process, which takes several minutes, the oxide on the (100) GaAs substrate is generated to protect the surface from carbon contamination. Their work is described in the Journal of Applied Physics, vol. 58, page 806 (1985). After transfer to the MBE growth chamber the surface oxide is thermally absorbed by heating the substrate wafers to 530° C. to 560° C. in a flux of $As_4$. When the desorption process is finished a clear ($2 \times 4$) surface reconstruction is observed in the reflection high energy electron diffraction (RHEED) pattern.

The layer sequence of the heterostructures includes an undoped 2-$\mu$m thick $p^-$-GaAs buffer layer with a residual doping concentratin of $10^{14}cm^{-3}$, an undoped $Al_{0.33}Ga_{0.67}As$ spacer of 18 nm thickness, a Si-doped $Al_{0.33}Ga_{0.67}As$ layer of 53 nm thickness, and an undoped GaAs cap layer of 8 nm thickness. After growth the epilayers were examined by a phase-contrast microscope. Hall effect measurements in the temperature range $4K<T<300K$ were performed on cleaved square-shaped specimensusing the van der Pauw technique. The samples were mounted in a continuous He flow cryostat, and the measurements were controlled by a computer.

FIG. 1 shows the micrograph of a typical area of the wafer treated in $H_2SO_4$ only, which clearly indicates the absence of any oval defects, i.e. defects of the type described in the papers by C. E. C. Wood, L. Rathbun, H. Ohno, D. De Simone in the Journal of Crystal Growth, vol. 51, pages 299 (1981) and by Y. Suzuki, M. Seki, Y. Horikoshi and H. Okaxoto in the Japanese Journal of Applied Physics, vol. 23, page 164 (1984). The total density of oval defects, originating mostly at the epilayer-substrate interface, is less than 200 $cm^{-2}$ for the 2 $\mu$m thick heterostructure grown on a substrate prepared in accordance with the invention. This result demonstrates that simple but careful preparation procedure of the GaAs substrate surface proposed herein, is crucial in obtaining nearly defect-free epilayers. It is important to note that a similar low density of oval defects for the specimen chemically etched in the $H_2SO_4$/$H_2O_4$/$H_2O$ mixture can be achieved only if the generation of the surface oxide during In soldering is performed under extremely dust-free conditions. Treatment of the GaAs substrate in accordance with the invention with $H_2SO_4$ makes the surface less sensitive to particulate contamination.

The advantages of the simple $H_2SO_4$ treatment of GaAs substrates can be demonstrated by means of Hall effect measurements on selectively doped n-$Al_{0.33}Ga_{0.67}As$/GaAs heterostructures. In FIG. 2 the Hall mobility is shown as a function of temperature obtained from two heterostructures deposited simultaneously on $H_2SO_4$/$H_2O_2$/$H_2O$-etched (sample 1) and on $H_2SO_4$-treated (sample 2) substrate slices. For the heterostructure grown on the $H_2SO_4$-treated surface (2) a Hall mobility is achieved of $\mu=7.3 \times 10^4$ cm$^2$/Vs with a 2DEG channel density of $n_s=4.4 \times 10^{11}$ cm$^{-2}$ at 300K. With reduced sample tempeerature the mobility strongly increases and at 6K reaches a value of $0.59 \times 10^6$ cm$^2$/Vs with $n_s=4.3 \times 10^{11}$ cm$^{-2}$ measured after illumination both at a magnetic field of 0.1 T. These mobility values are among the highest reported so far for selectively doped n-$Al_xGa_{1-x}As$/GaAs heterostructures having a spacer width as narrow as 18 nm. Similar mobility values and carrier densities were obtained for sample 1, which was grown on a conventionally $H_2SO_4$/$H_2O_2$/ $H_2O$-etched substrate, to within 10% of the sample 2 data (FIG. 2). This small difference is due to the uncertainty of the applied measuring method.

In conclusion, a new time-saving method for preparation of GaAs substrates for MBE growth has been provided which simply requires a treatment in $H_2SO_4$ after mechano-chemical polishing in NaOCl solution. This treatment significantly facilitates the generation of protective surface oxides during In soldering at elevated temperature and thus avoids particulate contamination. A density of oval defects of less than 200 cm$^{-2}$ is routinely achieved for 2 μm thick heterostructures grown on H$_2$SO$_4$-treated substrates. The advantage of the new substrate preparation method is demonstrated by a high-mobility 2DEG in selectively doped n-Al$_x$Ga$_{x-1}$As/GaAs heterostructures.

Using a spacer as narrow as 18 nm, mobilities in excess of 10$^6$ cm$^2$/Vs are achieved at 6K under illumination.

We claim:

1. A method of preparing semiconductor substrates to reduce the formation, in particular of oval defects, during subsequent growth of semiconductor structures thereon, in particular growth of heterostructures by molecular beam epitaxy, wherein the substrates are chemically cleaned and are provided with a thin oxide layer as protection against contamination during handling prior to growth of a said semiconductor structure thereon, characterised in that the substrate is first subjected to mechano-chemical etch polishing using an abrasive free fabric or paper polishing lap soaked with an oxidising etching solution and is then treated by placing it in a concentrated acid, in particular H$_2$SO$_4$ subjected to agitation.

2. A method in accordance with claim 1, characterised in that said oxidising etching solution is NaOCl, preferably with a concentration in the range 0.5 to 6.5 % active chlorine, and in particular with a concentration of 2.0 %.

3. A method in accordance with claim 1, characterised in that the substrate is GaAs and in that the concentrated acid is H$_2$SO$_4$.

4. A method in accordance with claim 1, wherein both said mechano-chemical etch polishing and said treatment in concentrated acid are carried out at room temperature.

5. A method in accordance with claim 1, characterised in that the substrate is sequentially placed in two separate baths of said concentrated acid and said baths are preferably subjected to ultrasonic agitation, with the duration of the treatment in the concentrated acid preferably lying between 5 and 10 minutes in each bath.

6. A method in accordance with claim 1, characterised in that the polishing lap comprises lens paper.

7. A method in accordance with claim 1, characterised in that the substrate is preheated under dust-free conditions in air prior to mounting to the substrate holder.

8. A method in accordance with claim 1, characterised in that, with a sawn substrate the sawn surface is first polished with diamond paste to remove saw-cut damage prior to mechano-chemical etch polishing.

9. A method in accordance with claim 1, characterised in that the treatment in the concentrated acid is effected for approximately 5 minutes or longer.

10. A method in accordance with claim 1, characterised in that said semiconductor substrate is indium phosphide.

11. A method in accordance with claim 1, characterised in that said oxidising-etching solution is bromium methanol.

* * * * *